United States Patent
Hackl

(10) Patent No.: US 11,353,492 B2
(45) Date of Patent: Jun. 7, 2022

(54) MONITORING DEVICE AND METHOD FOR INSULATION MONITORING OF AN UNGROUNDED ELECTRIC SUBSYSTEM HAVING A LIQUID COOLING OPERATED TO GROUND

(71) Applicant: BENDER GMBH & CO. KG, Gruenberg (DE)

(72) Inventor: Dieter Hackl, Fernwald (DE)

(73) Assignee: BENDER GMBH & CO. KG, Gruenberg (DE)

( * ) Notice: Subject to any disclaimer, the term of this patent is extended or adjusted under 35 U.S.C. 154(b) by 0 days.

(21) Appl. No.: 17/183,445

(22) Filed: Feb. 24, 2021

(65) Prior Publication Data
US 2021/0263093 A1    Aug. 26, 2021

(30) Foreign Application Priority Data
Feb. 26, 2020   (DE) .................... 10 2020 104 956.0

(51) Int. Cl.
  *H01H 31/12*   (2006.01)
  *G01R 31/12*   (2020.01)
  *H05K 7/20*    (2006.01)

(52) U.S. Cl.
  CPC ..... *G01R 31/1272* (2013.01); *G01R 31/1281* (2013.01); *H05K 7/20272* (2013.01); *H05K 7/20927* (2013.01)

(58) Field of Classification Search
  CPC .. G01R 31/085; G01R 31/52; G01R 31/1272; G01R 31/1281; G01R 27/18; G01R 27/22
  See application file for complete search history.

(56) References Cited

U.S. PATENT DOCUMENTS

| | | | | |
|---|---|---|---|---|
| 5,285,673 A | * | 2/1994 | Drexel | G01F 1/6888 73/1.16 |
| 6,265,883 B1 | * | 7/2001 | Clark | G01R 27/22 324/713 |
| 9,310,094 B2 | * | 4/2016 | Kates | F24F 11/30 |
| 9,791,195 B2 | * | 10/2017 | Okada | F24F 11/83 |
| 2004/0012395 A1 | * | 1/2004 | Salamitou | G01N 27/025 324/444 |
| 2009/0096464 A1 | | 4/2009 | Tanaka | |
| 2016/0273994 A1 | * | 9/2016 | McNab | G01M 3/18 |

FOREIGN PATENT DOCUMENTS

DE    102016009346 A1    2/2017
JP      2010164531 A     7/2010

* cited by examiner

*Primary Examiner* — Thang X Le
(74) *Attorney, Agent, or Firm* — Dickinson Wright PLLC; Andrew D. Dorisio

(57) ABSTRACT

A monitoring device and a method for monitoring an insulation resistance for an ungrounded electric system includes a liquid cooling operated to ground and having refrigerant flowing in tubes. For this purpose, the measuring signal is supplied in series in the tube system via the refrigerant resistance. The monitoring device is realized having a current measurement or a voltage measurement at the tube sections in order to detect the insulation resistance and can be enhanced for monitoring a shared insulation resistance of several ungrounded electric subsystems fed by a shared transformer.

14 Claims, 12 Drawing Sheets

MONITORING DEVICE AND METHOD FOR INSULATION MONITORING OF AN UNGROUNDED ELECTRIC SUBSYSTEM HAVING A LIQUID COOLING OPERATED TO GROUND

This application claims the benefit of German Patent Application No. 10 2020 104 956.0 filed on Feb. 26, 2020, the disclosure of which is incorporated herein by reference.

FIELD OF THE INVENTION

The invention relates to a monitoring device for monitoring an insulation resistance for an ungrounded electric system which comprises a liquid cooling which is operated to ground using a refrigerant and comprises a supply line and a return line, the supply line and the return line each being realized as an electrically conductive tube section which is connected to a ground potential and to which an electrically insulated tube section is connected which is connected to the electric system and has tube length $l_i$.

BACKGROUND OF THE INVENTION

When more is demanded of the operational, fire and contact safety, the network form of an ungrounded electric system is used which is also referred to as an insulated system (French: isolé terre (IT)) or IT system. All active parts are separated from the ground potential—to ground—in this kind of system. The advantage of such ungrounded electric systems is that the function of the electric system is not negatively affected when an insulation fault occurs since a circuit cannot be completed because of the ideally infinitely large impedance value between the electric system and ground. However, the resistance of the ungrounded electric system to ground (insulation resistance) must be constantly monitored since a fault loop may possibly come to being if another fault occurs and the flowing fault current in conjunction with an overcurrent protective device could cause the electric system to come to an operational standstill.

The insulation is monitored by means of an insulation monitoring device as known from the state of the art, the insulation monitoring device being switched between an active conductor of the electric system and ground, superimposing a measuring voltage as a measuring signal on the electric system to be monitored and evaluating a fault current flowing via the insulation resistance for determining the insulation resistance.

If the electric systems to be monitored comprises a power electronics, as is the case with numerous power converter applications having power semiconductors, for example, the heat produced in the electric system is then effectively dissipated via a liquid cooling system. A refrigerant preferably used is demineralized water. The refrigerant recirculation pump and the refrigerant preparation are mainly fed by a power supply system having a grounded network form (grounded power supply system) and are consequently connected to a ground potential. Most of the time, the refrigerant system is directly connected to the grounded drinking water supply system in order to be able to quickly compensate a refrigerant loss.

To be able to operate the electric system requiring cooling, such as a power converter, without being grounded and to be able to simultaneously supply the liquid cooling system using a grounded power supply system, electrically separating the grounded cooling system from the ungrounded electric system via electrically insulated refrigerant tubes or tube sections has been known.

However, complete galvanic insulation between the ungrounded electric system and the liquid cooling operated to ground is not possible because of the virtually always present electrolytic conductivity of the refrigerant which fluctuates for reasons to do with the process. This incomplete electric disconnection between the otherwise insulated ungrounded electric system and the liquid cooling operated to ground can be modeled by a refrigerant resistance $R_K$.

FIG. 1 shows the difficulties encountered by the invention. An ungrounded power supply system 2, exemplarily illustrated as a power converter having refrigerant-cooled power electronics, is connected to a liquid cooling operated to ground. The liquid cooling comprises a refrigerant drive 4 which is connected to electric system 2, which is to be cooled, via a supply line 6 and a return line 8 through both of which refrigerant 3 flows. Both supply line 6 and return line 8 are composed of an electrically conductive tube section 10 which is connected to ground potential PE. An electrically insulated tube section 12 which opens at electric system 2 connects to electrically conductive tube section 10—of supply line 6 and return line 8, respectively—in the direction of electric system 2.

For monitoring insulation resistance $R_f$ of electric system 2, electric system 2 is equipped with an insulation monitoring device 14, conforming to standards.

The electrolytic conductivity of the refrigerant is represented by cooling resistance $R_K$ as a concentrated element and lies parallel to insulation resistance $R_f$. If refrigerant resistance $R_k$ takes up an inadmissibly small value in comparison to insulation resistance $R_f$ when the conductivity of refrigerant 3 is too high, electric system 2 can no longer be reliably monitored according to standard using insulation monitoring device 14. If refrigerant resistance $R_K$ lies parallel to a (system) insulation resistance $R_f$ which has a high insulation level of, for example, one MΩ, with completely typical values of only a few kΩ, the insulation monitoring device should continuously issue an alarm because of low refrigerant resistance $R_K$ despite a good insulation state of electric system 2 in order to fulfill the standard requirements.

These deliberations make clear that standardized monitoring is not possible.

The difficulties become even more explicit when several ungrounded electric subsystems 16, e.g., several high-performance power converters, are fed by a shared ungrounded transformer 15 for cost reasons.

FIG. 2 shows such a constellation which exemplarily shows three ungrounded electric subsystems 16 fed by a shared transformer 15. Assuming the geometry of the refrigerant supply and the electrolytic conductivity of refrigerant 3 is the same in all three electric subsystems 16, approximately one third of the value of refrigerant resistance $R_K$ from FIG. 1 is yielded for the overall refrigerant resistance. The systematic fault caused thereby when determining insulation resistance $R_f$ using an insulation monitoring device 14 becomes inadmissibly large.

According to the state of the art, constructive measures can be applied when designing the system to ensure the refrigerant resistance becomes large enough to keep the systematic fault small when monitoring the insulation according to standard requirements in order to solve the problem. Known measures are, for example, correspondingly designing the geometry of the refrigerant supply and using high-quality materials to keep effects of corrosion and/or migration to a minimum when using refrigerants having very small conductor values.

These constructive measures, however, lead to significantly higher costs for the system, meaning in practice the response values of the insulation monitoring device for the pre-alarm and main alarm are set to a very low-impedance level, thereby deviating from standard recommendations. Metrologically, the insulation monitoring devices in this environment therefore function in a limit range and outside of their technical specifications. This also means frequent alarms for faults for the user.

SUMMARY

The object of the invention at hand is therefore to propose a monitoring device for an ungrounded electric system, which is operated using a liquid cooling operated to ground, and a method for monitoring the insulation resistance, both of which will allow a reliable and cost-effective monitoring of the insulation resistance.

The fundamental inventive idea is that a measuring signal is serially fed via the refrigerant resistance for determining the insulation resistance. In contrast to the state of the art where the measuring signal is coupled to an active conductor to ground parallel to refrigerant resistance $R_K$, refrigerant resistance $R_K$ is not parallel to insulation resistance $R_f$ which is to be detected, in the design according to the invention but is switched in series thereto. The systematic fault described above is no longer applicable.

Depending on the manner in which the measuring signal is coupled—a shared coupling via the supply line and the return line or a one-sided coupling only into the supply line or the return line—, the monitoring device therefore comprises one or two low-impedance measuring signal sources which each generate a measuring signal in the form of a measuring voltage. The measuring signal source(s) is/are contacted with the ground potential via a ground potential connection having the electrically conductive tube section.

For coupling the measuring signal, a coupling connection of the measuring signal source is connected to a conductive coupling tube element contacted with the refrigerant.

For measuring a coupling current, which flows in the refrigerant flowing through the electrically insulated tube section, a coupling-current measuring sensor is disposed at the electrically insulated tube section.

A fault-current measuring sensor is switched downstream of the coupling-current measuring sensor in the direction of the electric system. This serves for measuring a fault current which also occurs in the refrigerant flowing through the electrically insulated tube section and is taken into account for determining the insulation resistance.

On the electrically insulated tube section, the (one-part) coupling tube element is disposed in such a manner between the coupling-current measuring sensor disposed on the ground-potential side and the fault-current measuring sensor disposed on the system side (or if the coupling tube element has two parts, both coupling tube elements are disposed in such a manner) that the tube length of the electrically insulated tube section is divided into a coupling length extending between the electrically conductive tube section and the coupling tube element and a resistance length extending from the coupling tube element to the electric system.

To compute the insulation resistance from the measuring voltage, the detected coupling current, the detected fault current, the coupling length and the resistance length, the monitoring device comprises a computing unit, e.g., in the form of a microprocessor.

Starting from the refrigerant drive fed by a grounded power supply system and electrically conductive tube sections connected thereto, the order in which the elements coupling-current measuring sensor, coupling tube element and fault-current measuring sensor are disposed is always the same; the construction for attaching these elements to the supply line and/or the return line can differ, however.

In a possible embodiment, the fault-current measuring sensor comprises a fault-current measuring current transformer which encircles both the supply line and the return line. Likewise, the coupling-current measuring sensor comprises a coupling-current measuring current transformer which encircles both the supply line and the return line.

The coupling tube element is either realized in one part and connected to the measuring signal source so that the measuring signal is coupled synchronously into both the supply line and the return line in common mode, or the coupling tube element is realized in two parts and consists of a supply-line coupling tube element and a return-line coupling tube element. The latter two elements are each connected to one of the measuring signal sources and synchronously couple the corresponding measuring signals into the supply line and the return line on one side in common mode. The measuring signal is therefore always coupled into the supply line and the return line.

The fault-current measuring sensor comprises a fault-current measuring current transformer and the coupling-current measuring sensor comprises a coupling-current measuring current transformer, the fault-current measuring-current transformer and the coupling-current measuring current transformer both encircling the supply line on one side or the return line on one side.

Using the monitoring device according to the invention for monitoring the insulation resistance for an electric system, which is an ungrounded power converter system, proves to be advantageous.

In particular high-performance power converter systems (inverter systems, rectifier systems and converter systems) which require a high cooling capacity, can be monitored reliably with regard to the insulation resistance using the monitoring device according to the invention.

A remaining measuring imprecision with the galvanically insulated current measurement via the fault-current measuring sensor and the coupling-current measuring sensor can be reduced by detecting a measuring current via the voltage drop at a load resistance in the measuring-voltage source. These deliberations yield an approach according to the invention using voltage measurement as an alternative to current measurement, albeit the inventive approach presumes known and reliable geometry relations of the refrigerant supply.

The object of the invention is thus further attained by a monitoring device.

In this embodiment, the monitoring device also comprises a low-impedance measuring signal source for generating a measuring signal having a measuring voltage. The measuring signal source comprises a ground-potential connection which is connected to the electrically conductive tube section and a coupling connection. A conductive coupling tube element, which contacts the refrigerant and synchronously couples the measuring signal into the supply line and the return line in common mode, is connected to this coupling connection of the measuring signal source.

This embodiment of the monitoring device does not comprise current measurement but instead comprises a voltage meter and a conductive voltage-meter tube element which contacts the refrigerant and serves for measuring a partial voltage on the electrically insulated tube section.

A first voltage-meter input of the voltage meter is connected to the coupling connection of the measuring signal source, a second voltage-meter input of the voltage meter being connected to the voltage-meter tube element for detecting the partial voltage.

The coupling tube element is disposed in such a manner on the electrically insulated tube sections that a certain coupling length is yielded on the electrically insulated tube sections between the system-sided end of the electrically conductive tube sections disposed on the ground-potential side and the coupling tube element. Adjacent thereto in the direction of the electric system, the voltage-meter tube element is disposed in such a manner on the electrically insulated tube sections that a distance having a defined voltage-meter length is set between the coupling tube element and the voltage-meter tube element. A defined resistance length on the electrically insulated tube sections is yielded between the voltage-meter tube element and the electric system.

In this embodiment having the voltage measurement, the monitoring device also comprises a computing unit which is configured for computing the insulation resistance from the measurement voltage, the measuring signal, a supplied measuring current, the partial voltage, the coupling length, the voltage-meter length and the resistance length.

Using the monitoring device is advantageous for monitoring the insulation resistance for an ungrounded power converter system as an electric system in order to meet the cooling demands for high-performance power converter systems.

Starting from the monitoring device having a current measurement and the embodiment of the monitoring device having a voltage measurement, an enhanced monitoring device is designed for monitoring a shared insulation resistance of several ungrounded electric subsystems fed by a shared transformer.

Taking the shared transformer into account, the corresponding electric subsystems correspond to the ungrounded electric system which is described above and comprises a liquid cooling which is operated to ground using a refrigerant and has a supply line and a return line.

According to the invention, at least two of the ungrounded electric subsystems in the enhanced monitoring device are equipped with a monitoring device.

The enhanced monitoring device further comprises a synchronization control device for synchronously coupling the measuring signals into the corresponding electric subsystems to be monitored.

Thus, a temporally synchronous measuring-signal progression of the measuring signals is ensured which are generated by the measuring signal sources and fed into the corresponding subsystem.

Advantageously, the synchronization control device comprises an amplitude control device for controlling the measuring-signal amplitudes of the measuring signals generated in the corresponding monitoring devices.

The measuring-signal amplitudes in the corresponding monitoring devices assigned to the electric subsystems need not necessarily be controlled; however, the control can be used to set occurring leakage currents to ground or residual voltages to ground for each electric subsystem to about the same intensity when the geometric design of the refrigerant supply is uneven. This prevents an uneven current or voltage load of individual electric subsystems, for an extreme deviation of the leakage currents in the individual electric subsystems can lead to an additional systematic measuring fault occurring via the corresponding measuring signal sources and/or current sensors entering an unfavorable working area.

Advantageously, the measuring-signal amplitude can be controlled for each electric subsystem to be controlled using the amplitude control device, meaning that the overall operational measuring safety of the insulation monitoring system is increased largely independently of fluctuations of parameters of the refrigerant system (e.g., fluctuations of the electrolytic conductivity) caused by the process and of the differences to be expected in the geometric design of the refrigerant circuit (e.g., different lengths of the refrigerant tubes).

The embodiments of the monitoring devices described above according to the invention are based on the technical teachings. In this respect, the technical effects mentioned above and the advantages resulting therefrom also apply to the features described in the method claims.

Advantageously, coupling options present owing to the system and the design of the refrigerant supply can be used in particular in refrigerant-cooled power converter applications, whereby a metrological optimization is attained by preventing a refrigerant resistance to ground parallel to the insulation resistance.

Advantageously, the performance applied in the insulation monitoring device and its voltage load can be reduced in medium-voltage applications.

BRIEF DESCRIPTION OF THE FIGURES

Further advantageous embodiment features are derived from the following description and the drawings which describe preferred embodiments of the invention using examples.

DETAILED DESCRIPTION

Figure 1:
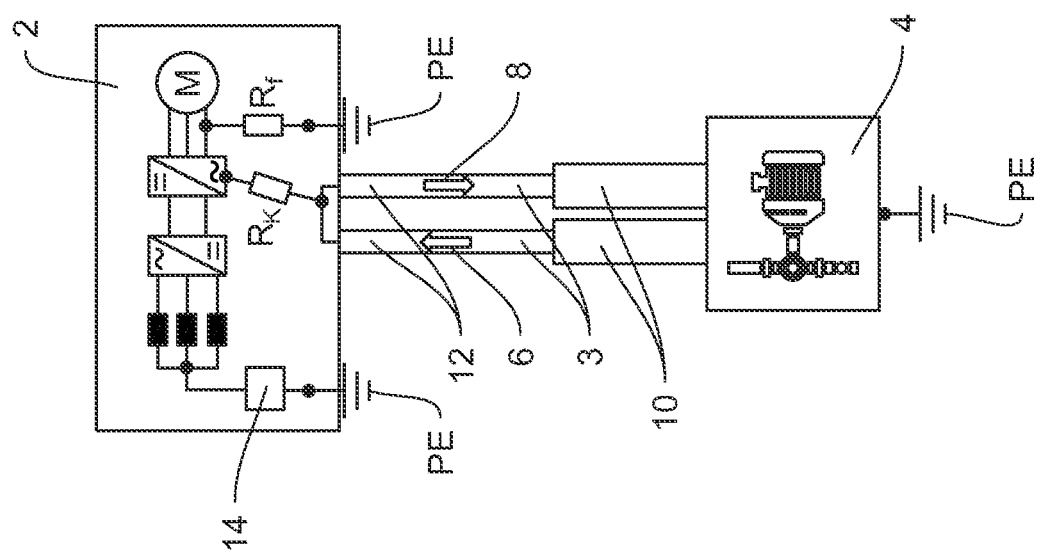
FIG. 1 shows an ungrounded electric system having a liquid cooling operated to ground.

To clarify the underlying difficulties, FIG. 1 shows an ungrounded electric system 2 which comprises a liquid cooling which is operated to ground using a refrigerant 3 and has a supply line 6 and a return line 8.

An electrically conductive tube section 10 is disposed at a refrigerant drive 4 (on the ground-potential side) for supply line 6 and return line 8 of refrigerant 3, respectively, and is connected to the ground potential PE, an electrically insulated tube section 12 being connected to tube section 10 (on the system side) and opening into ungrounded electric system 2.

To determine insulation resistance $R_f$ of electric system 2 between one or several active conductors to ground PE, an insulation monitoring device 14 is switched between ungrounded electric system 2 and ground PE according to the state of the art.

As a consequence of the electrolytic conductivity of refrigerant 3, electric system 2 is not entirely electrically insulated against ground PE. Consequently, there is an electrically conductive connection to ground PE which is modelled as a concentrated element via refrigerant resistance $R_K$. This refrigerant resistance $R_K$ lies parallel to insulation resistance $R_f$ to be detected and affects the measurement of the insulation resistance considerably.

Figure 2:
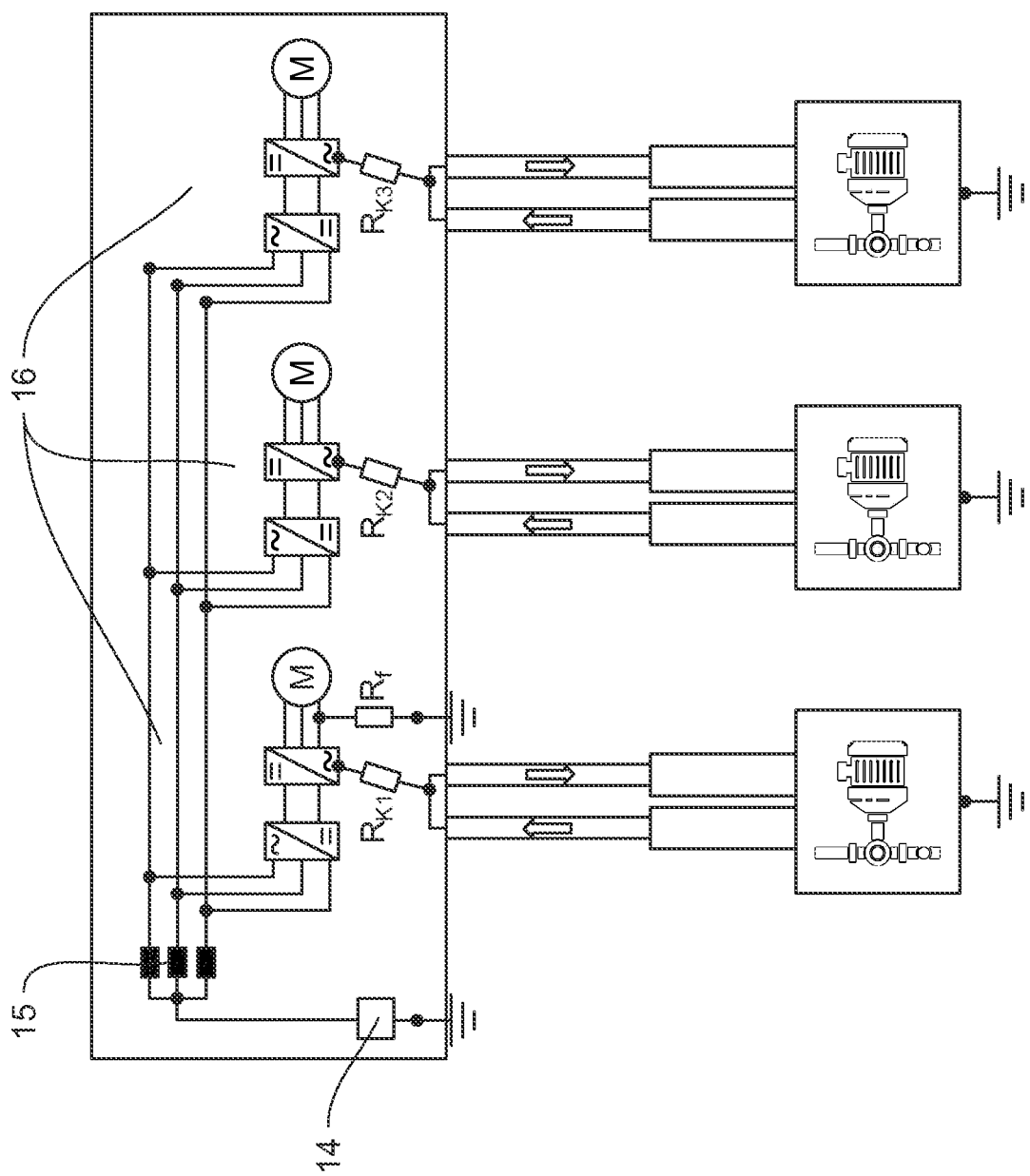
FIG. 2 shows electric subsystems fed by a shared transformer.

FIG. 2 shows the position of three electric subsystems 16 which are fed by a shared transformer 15. As a consequence of the parallel circuit of electric subsystems 16, the overall refrigerant resistance is reduced to approximately a third and consequently results in an even more imprecise determination of insulation resistance $R_f$.

Figure 3:
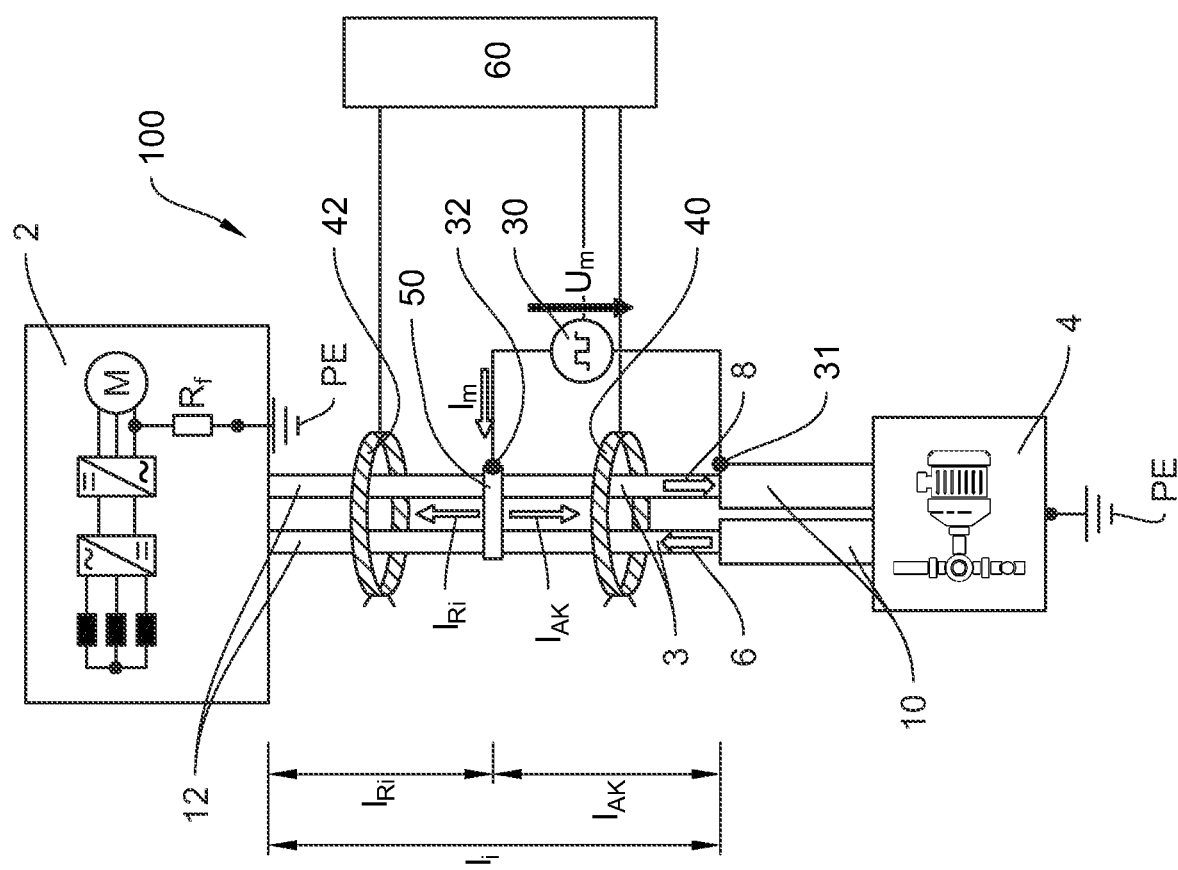
FIG. 3 shows a monitoring device according to the invention having a shared current measurement and a one-piece measuring-signal coupling.

FIG. 3 shows a monitoring device 100 according to the invention having a shared current measurement and a one-part measuring-signal coupling in the application for an ungrounded electric system which is illustrated in FIG. 1 and has a liquid cooling operated to ground.

On the ground-potential side, a coupling-current measuring sensor 40 is disposed at electrically insulated tube section 12 having tube length $l_i$, the coupling-current measuring current transformer of coupling-current measuring sensor 40 encircling both supply line 6 and return line 8. Coupling-current measuring sensor 40 comprising a coupling current $I_{AK}$ which flows in refrigerant 3 flowing through electrically insulated tube section 12.

A fault-current measuring sensor 42 is switched downstream of coupling-current measuring sensor 40 in the direction of electric system 2, encircles both supply line 6 and return line 8 and detects a fault current IR, which is set in refrigerant 3 flowing through electrically insulated tube section 12 ("above" the measuring-signal coupling in the drawing).

Between coupling-current measuring sensor 40 and fault-current measuring sensor 42, a one-part coupling tube element 50 is attached in electrically insulated tube section 12 at a distance of a coupling length $l_{AK}$ (measured from electrically conductive tube section 10 on the end of the system side). From coupling tube element 50 to the connection of electrically insulated tube section 12 to electric system 2, a resistance length $l_{Ri}$ remains which yields tube length $l_i$ of electrically insulated tube section 12 in conjunction with coupling length lax.

To supply a measuring signal (measuring voltage $U_m$), one-part coupling tube element 50 is connected to a measuring-voltage source 30 via a coupling connection 32. A ground-potential connection 31 of measuring signal source 30 lies on ground potential PE, for example connected to electrically conductive tube section 10.

For computing insulation resistance $R_f$, monitoring device 100 comprises a computing unit 60 which evaluates the output signals of coupling-current measuring sensor 40, of fault-current measuring sensor 42 and of measuring signal source 30.

Figure 4:
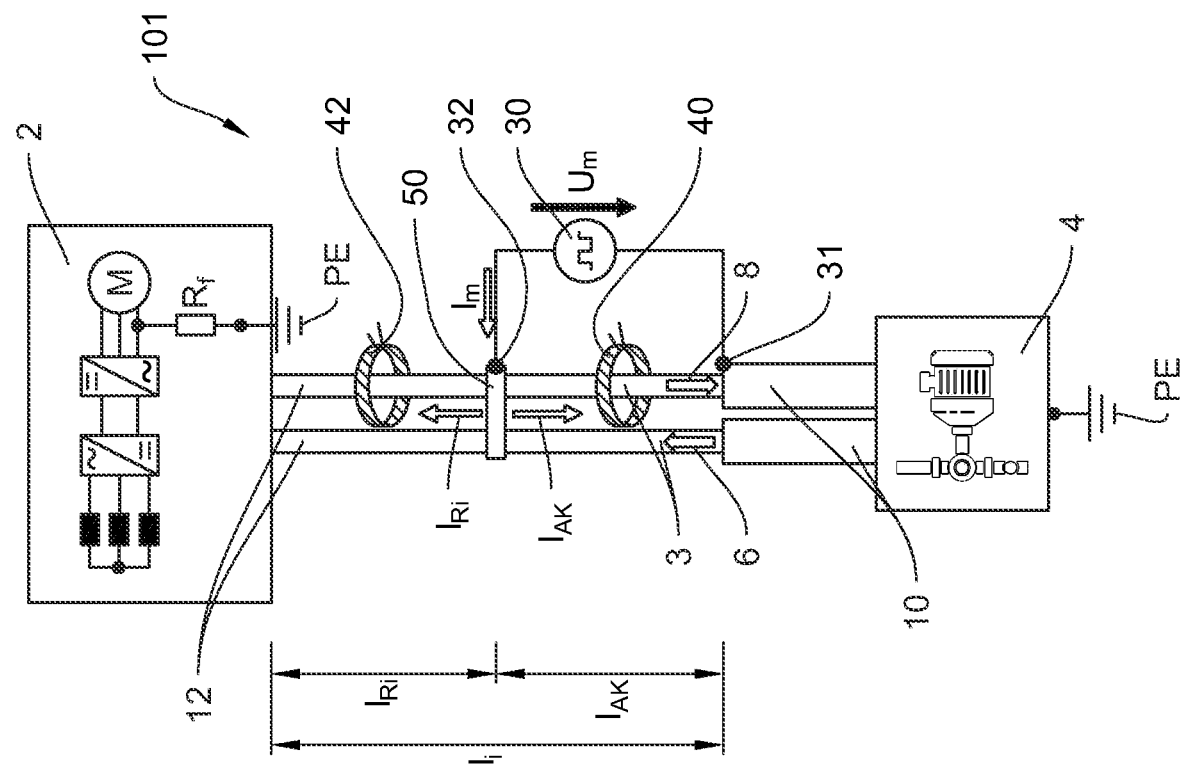
FIG. 4 shows a monitoring device according to the invention having a one-sided current measuring and a one-part measuring-signal coupling.

FIG. 4 shows an embodiment of monitoring device 101 according to the invention having a one-sided current measurement and a one-part measuring-signal coupling.

In contrast to the embodiment illustrated in FIG. 3, the coupling-current measuring sensor 40 and fault-current measuring sensor 42 are realized to be one-sided, i.e., both measuring current transformers either disposed on one side around supply line 6 or both on one side around return line 8.

In the same manner as monitoring device 100 illustrated in FIG. 3, monitoring device 101 comprises a computing unit 60 not illustrated in FIG. 4.

Figure 5:
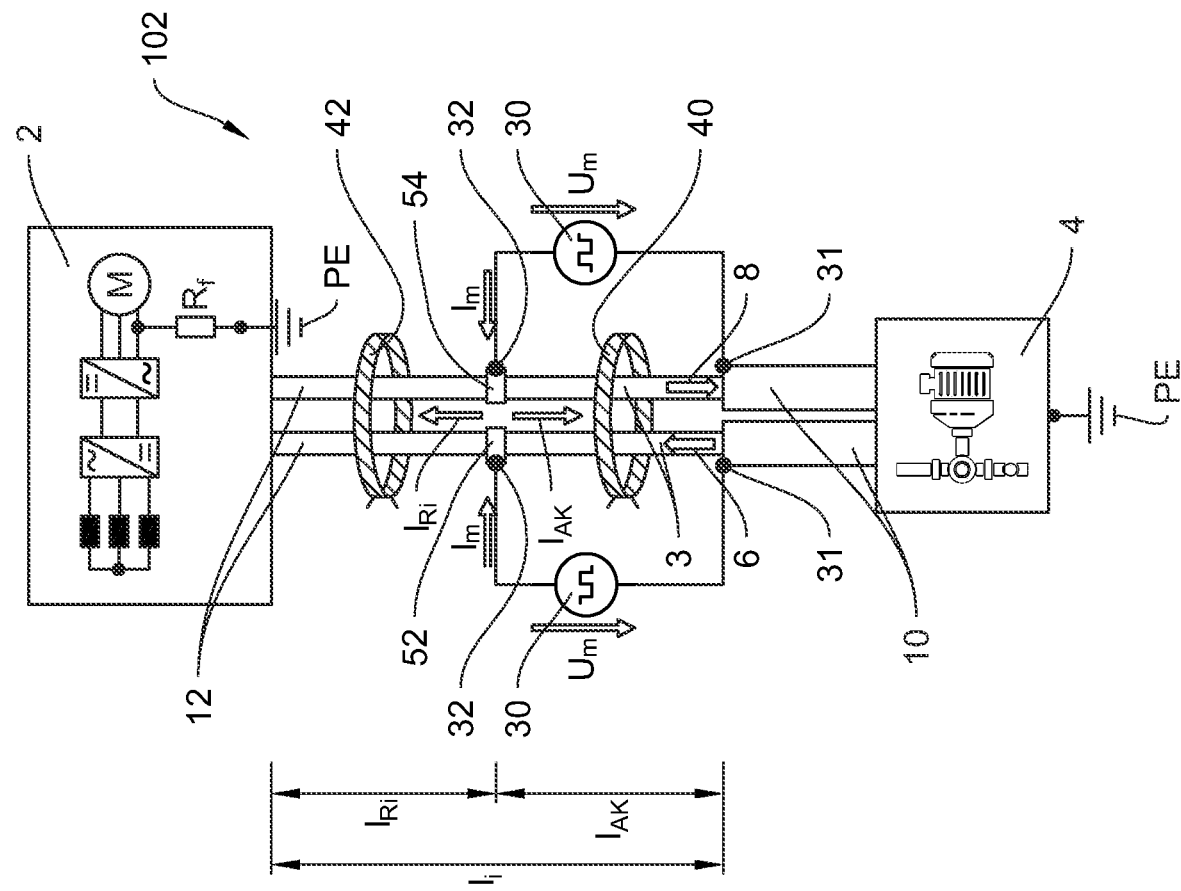
FIG. 5 shows a monitoring device according to the invention having a shared current measurement and a two-part measuring-signal coupling.

FIG. 5 shows another embodiment of monitoring device 102 having a shared current measuring and a two-part measuring-signal coupling.

The current is measured in the same manner as with monitoring device 100 illustrated in FIG. 3 using a coupling-current measuring sensor 40 disposed on the ground-potential side and a fault-current measuring sensor 42 disposed on the system side, both measuring sensors 40 and 42 encircling supply line 6 and return line 8.

Coupling tube element 50, however, is divided into two parts: a supply-line coupling tube element 52 and a return-line coupling tube element 54. Supply-line coupling tube element 52 and return-line coupling tube element 54 are each connected to a measuring signal source 30, the corresponding measuring signals being synchronously coupled into both supply line 6 and return line on one side in common mode.

If the measuring signal were not synchronously coupled into supply line 6 and return line 8 to ground in common mode, for example the measuring signal were only coupled into supply line 6, electric leakage currents would lie parallel to determined insulation resistance $R_f$ again as an electric resistance via refrigerant return line. The object at hand would consequently not be attained.

Figure 6:
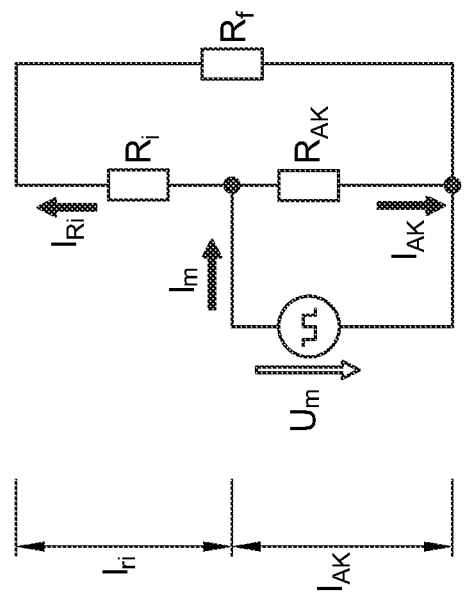
FIG. 6 shows an equivalent circuit diagram for determining the insulation resistance according to FIG. 3.

In FIG. 6, an equivalent circuit diagram is illustrated derived from monitoring device 100 according to FIG. 3 for determining the insulation resistance $R_f$.

Refrigerant resistance $R_K$ modeled in FIG. 1 is represented by a coupling resistance $R_{AK}$ and an internal resistance $R_i$. Coupling resistance $R_{AK}$ is correspondingly yielded from the quotient of the amplitudes of synchronously imprinted measuring signal $U_m$ and coupling current $I_{AK}$ detected by coupling-current measuring sensor 40 as $$R_{AK} = \frac{U_m}{I_{AK}}.$$

Starting from a constant cross section of the refrigerant supply and a constant electrolytic conductivity of refrigerant 3 along the refrigerant supply, internal resistance $R_i$ can be determined from the previously detected value of coupling resistance $R_{AK}$ and the ratio of resistance length $l_{Ri}$ to coupling length lax in electrically insulated tube section 12 as follows:

$$R_i = R_{AK} * \frac{l_{Ri}}{l_{AK}}.$$

According to the invention, fluctuations of the electrolytic conductivity of refrigerant 3 are identified via the change of inner resistance $R_i$ and can be taken into consideration when determining insulation resistance $R_f$. A systematic measuring error is thus prevented.

It is to be noted that refrigerant 3 flowing through supply line 6 and return line 8 in the electric equivalent circuit diagram is represented in its electric efficiency as a(n individual) resistance $R_i$ and/or a(n individual) coupling resistance $R_K$.

Starting from the electric equivalent circuit diagram, insulation resistance $R_f$ can be determined as follows using the current divider rule:

$$R_f = \frac{U_m}{I_{AK}} * \left( \frac{I_{AK}}{I_{Ri}} - \frac{l_{Ri}}{l_{AK}} \right)$$

Figure 7:
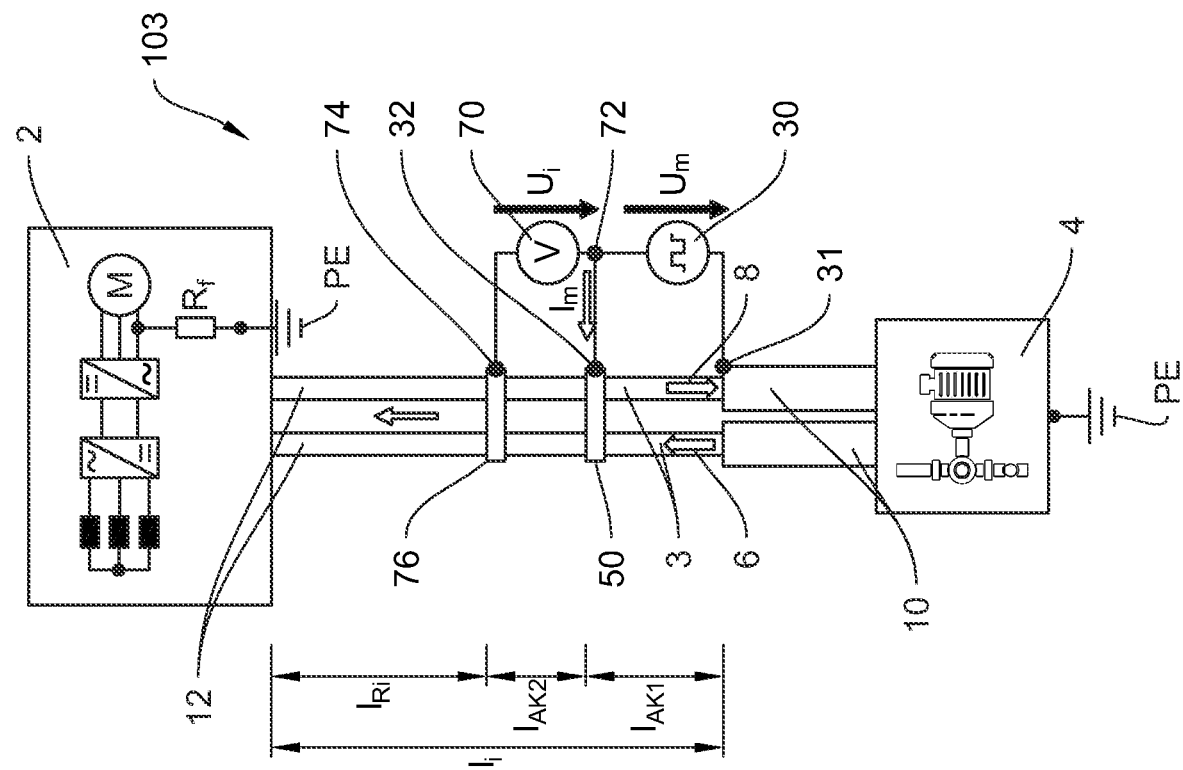
FIG. 7 shows a monitoring device according to the invention having voltage measurement.

FIG. 7 shows a monitoring device 103 according to the invention having a voltage measurement.

In this embodiment, the current measurement described in previous embodiments is substituted for a voltage measurement having a voltage meter 70.

The measuring signal is coupled in the same manner as in the embodiments described above using a low-impedance measuring signal source 30 to which a coupling tube element 50 disposed on electrically insulated tube section 12 is connected at a distance of a coupling length $l_{AK1}$—measured from the system-sided end of electrically conductive tube section 10.

Voltage meter 70 is connected to coupling connection 32 of measuring signal source 30 at a first voltage-meter input 72 for measuring a partial voltage $U_i$ and comprises a second voltage-meter input 74 which is connected to a conductive voltage-meter tube element 76 contacted with refrigerant 3.

Voltage-meter tube element 76 is disposed downstream of coupling tube element 50 in the direction of electric system 2 at the distance of a voltage length $l_{AK2}$. Starting from voltage-meter tube element 76, a resistance length $l_{Ri}$ remains in the direction of electric system 2, resistance length $l_{Ri}$ yielding tube length $l_i$ of electrically insulation tube section 12 in conjunction with coupling length $l_{AK1}$ and coupling length $l_{AK2}$.

Computing unit 60 (not illustrated) detects insulation resistance $R_i$ from the detected sizes.

Figure 8:
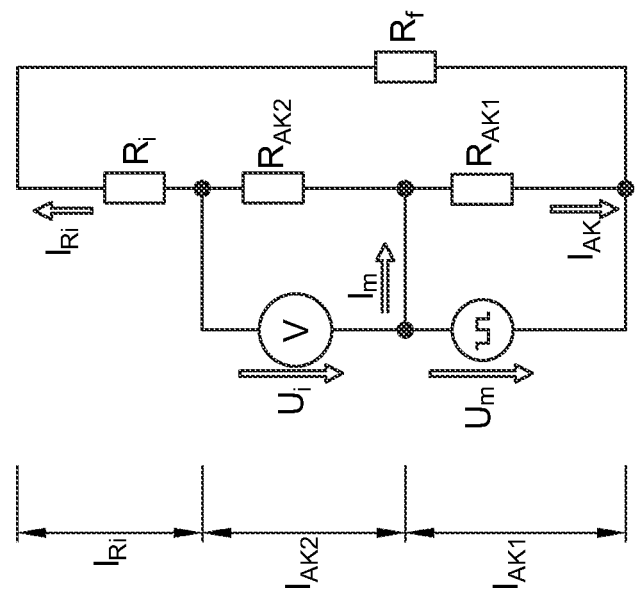
FIG. 8 shows an equivalent circuit diagram for determining the insulation resistance according to FIG. 7.

FIG. 8 shows an electric equivalent circuit diagram derived from monitoring device 103 according to FIG. 7 for detecting insulation resistance $R_f$.

The equivalent circuit diagram from FIG. 6 for monitoring device 100 having a current measurement has been modified for monitoring device 103 having a voltage measurement. In addition to coupling resistance $R_{AK1}$, a measuring resistance $R_{AK2}$ is added which is switched in series and via which partial voltage $U_i$ present on electrically insulated tube section 12 is detected.

Since no current is detected, fault current $I_{Ri}$ and coupling current $I_{AK}$ are not initially known. A change is made to the computation formula indicated in FIG. 5, the insulation resistance being computed based on the equivalent circuit diagram according to FIG. 8 as follows:

$$Rf = \frac{(U_i + K_2 * U_m) * (K_2 * U_m - U_i * (K_2 + K_i))}{U_i * K_2 * I_m} \text{ with } K_2 =$$

$$\frac{l_{AK2}}{l_{AK1}} \text{ and } K_i = \frac{l_{Ri}}{l_{AK1}}$$

Figure 9:
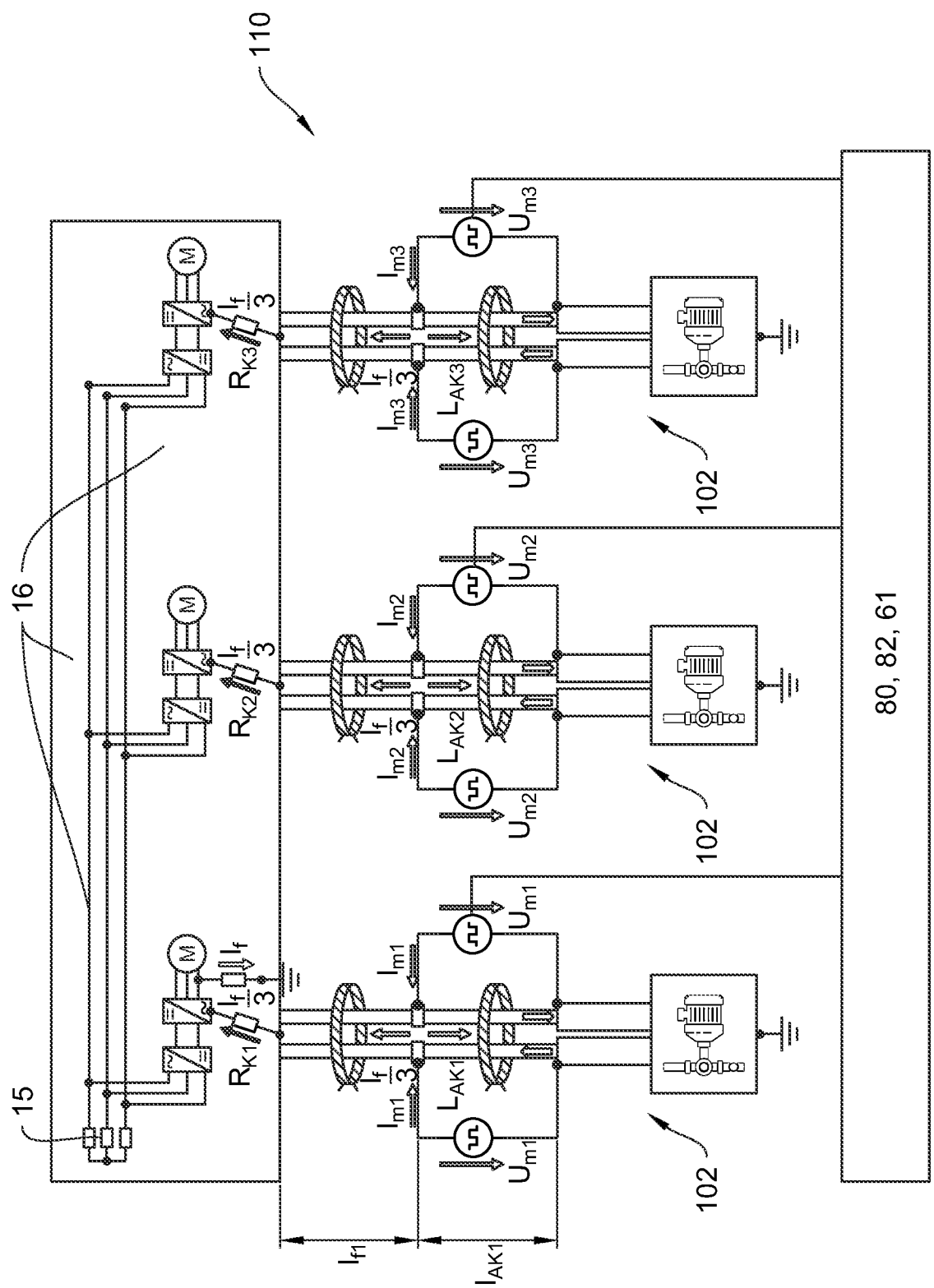
FIG. 9 shows an enhanced monitoring device according to the invention having voltage measurement.

FIG. 9 shows an enhanced monitoring device 110 according to the invention for three ungrounded electric subsystems 16 fed by a shared transformer 15.

A monitoring device 102 according to FIG. 5 and the invention is assigned to each of subsystems 16 to be monitored. Monitoring device 102 according to FIG. 5 is chosen as an example in this instance; in general, any of claimed monitoring devices 100, 101, 102, 103 can be assigned to any of subsystems 16 to be monitored.

Enhanced monitoring device 110 comprises a synchronization control device 80 which enables synchronously coupling the measuring signals into corresponding electric subsystems 16 to be monitored.

Additionally, an amplitude control device 82 is integrated in synchronization control device 80 and controls the measuring-signal amplitudes of the measuring signals generated in corresponding monitoring devices 102.

Moreover, the computing unit disposed in individual monitoring devices 102 can be substituted for a shared superordinate computing unit 61.

Figure 10:
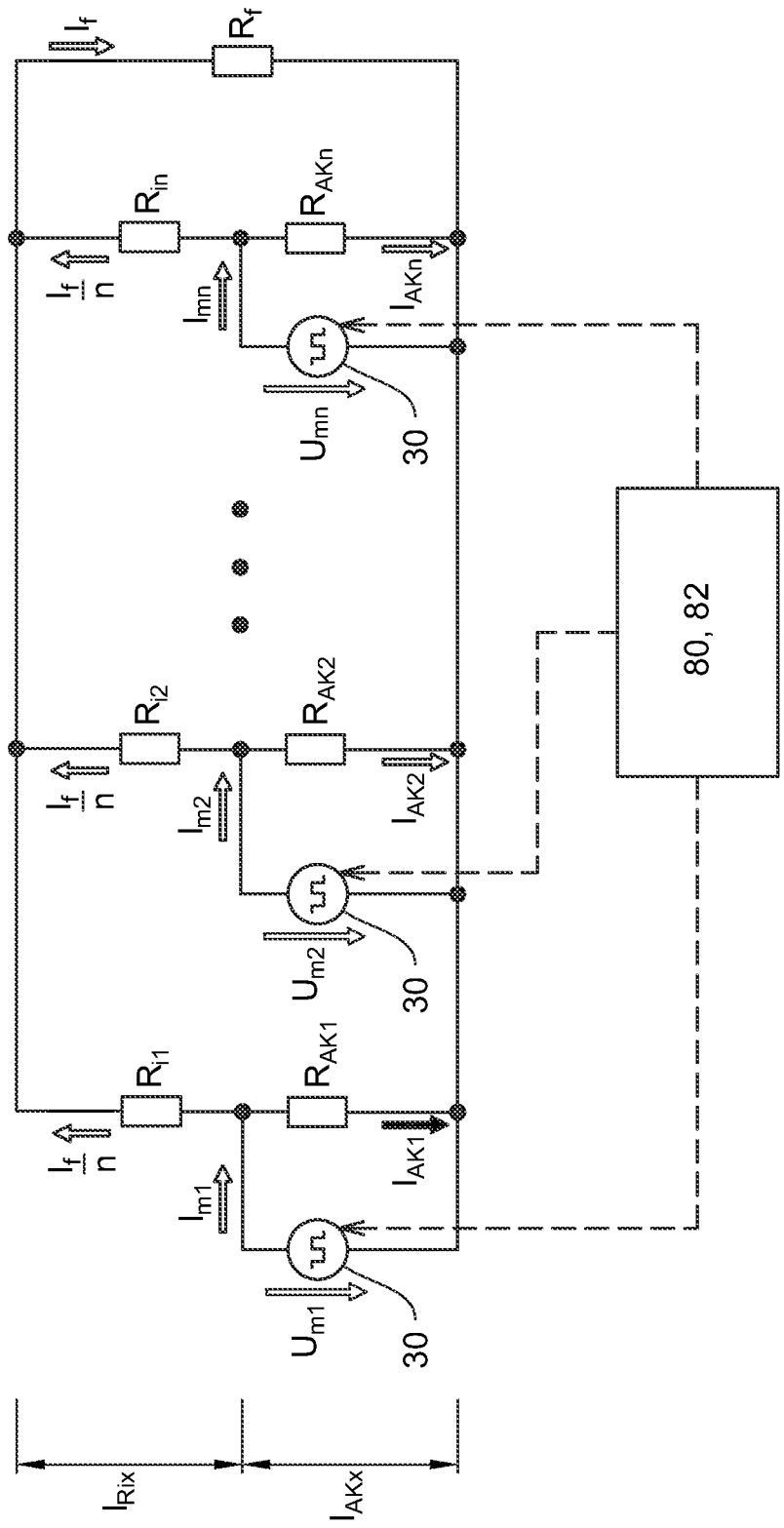
FIG. 10 shows an equivalent circuit diagram for determining the insulation resistance according to FIG. 9.

FIG. 10 shows an electric equivalent circuit diagram for determining insulation resistance $R_f$ having an enhanced monitoring device 110 according to FIG. 9.

Since enhanced monitoring device 110 is suitable for a use of n (n≥2) electric subsystems, the equivalent circuit diagram is generally valid for n electric subsystems.

The equivalent circuit diagram additionally shows a function group consisting of synchronization control device 80 and amplitude control device 82 which are connected to corresponding measuring signal sources 30.

Based on the equation of the equivalent circuit diagram in FIG. 5, the computation of an overall insulation resistance value $R_f$ can be determined as shown below by adding the individual conductor values and/or as a parallel circuit of computed individual insulation resistance values $R_{fi}$ for a design consisting of n electric subsystems 16 and fed by a shared transformer 15:

$$R_f = \frac{1}{\sum_{i=1}^{n} \frac{1}{R_{fi}}}.$$

Individual insulation resistance values $R_{fi}$ in the formula above determine themselves analogously to the equation of FIG. 6 to $$R_{f1} = \frac{U_{m1}}{I_{AK1}} * \left( \frac{I_{AK1}}{I_{Ri1}} - \frac{l_{Ri1}}{l_{AK1}} \right) R_{f2} = \frac{U_{m2}}{I_{AK1}} * \left( \frac{I_{AK2}}{I_{Ri2}} - \frac{l_{Ri2}}{l_{AK2}} \right) R_{fn} = \frac{U_{mn}}{I_{AKn}} * \left( \frac{I_{AKn}}{I_{Rin}} - \frac{l_{Rin}}{l_{AKn}} \right).$$

Figure 11:
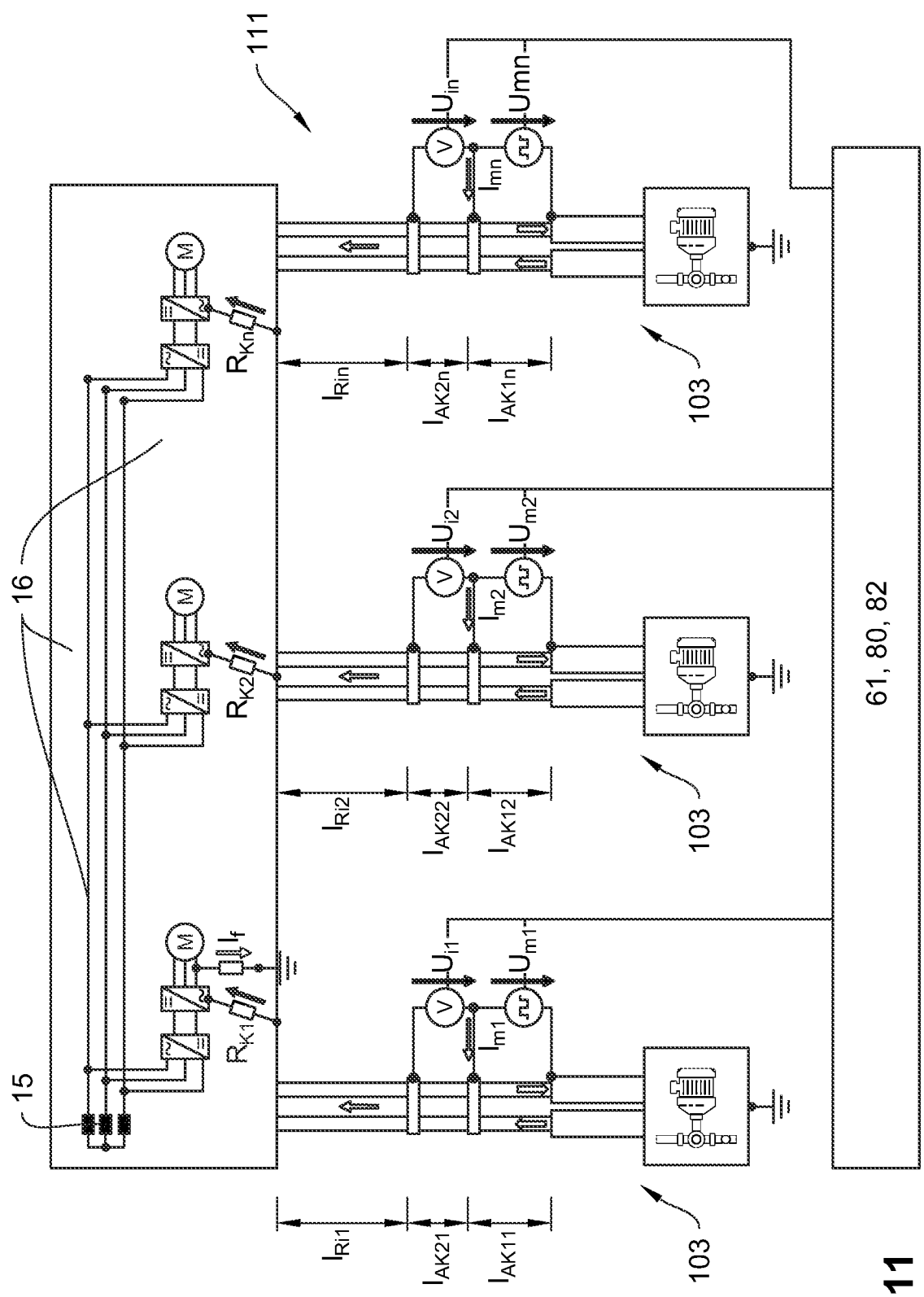
FIG. 11 shows an enhanced monitoring device having voltage measurement.

FIG. 11 shows an enhanced monitoring device 111 for three electric subsystems 16 which are fed together, each of these subsystems being equipped with a monitoring device 103 according to the invention having a voltage measurement according to FIG. 7.

Enhanced monitoring device 111 comprises a synchronization control device 80, a shared computing unit 61 and an optional amplitude control device 82.

Figure 12:
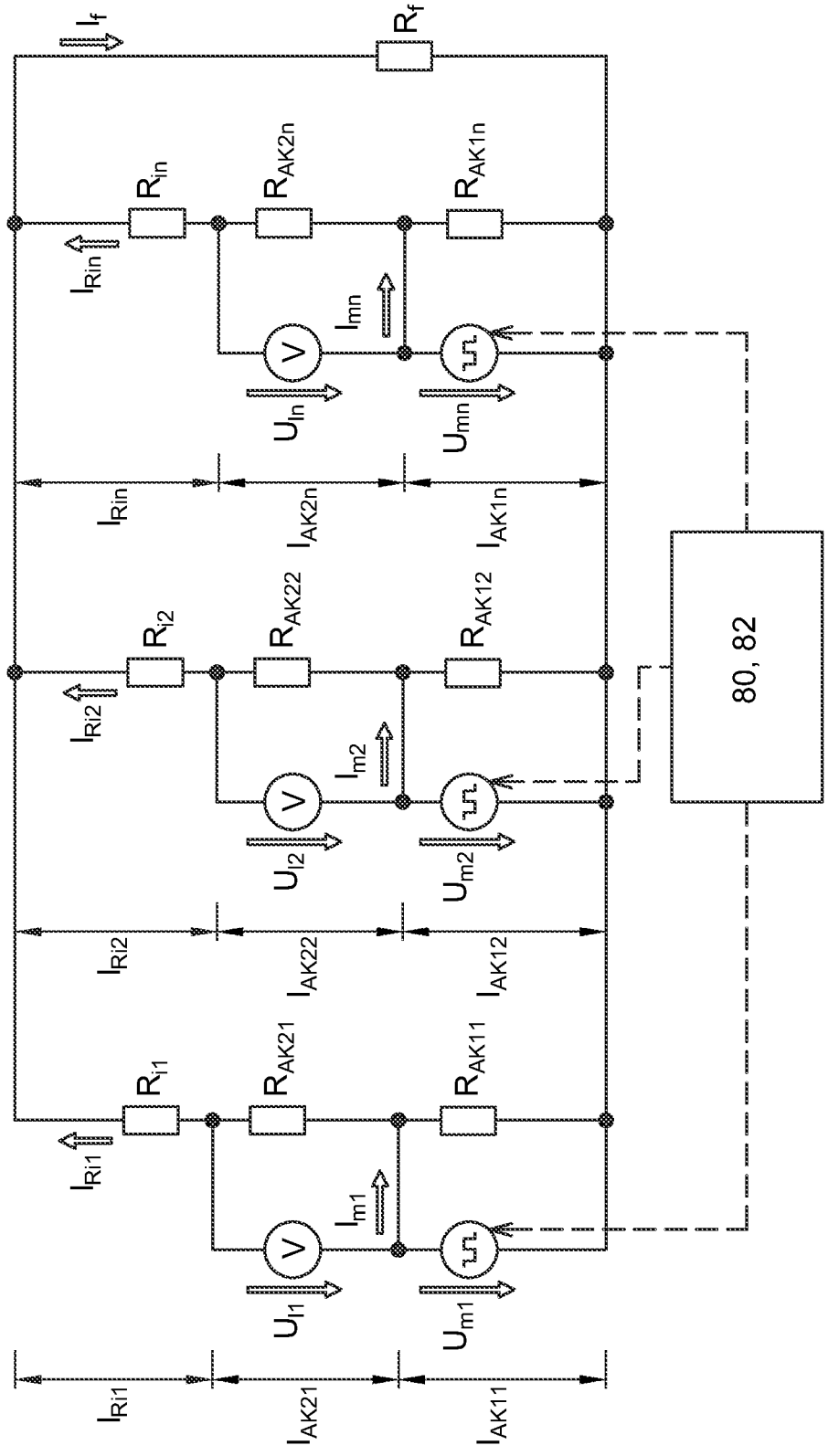
FIG. 12 shows an equivalent circuit diagram for determining the insulation resistance according to FIG. 11.

FIG. 12 shows an electric equivalent circuit diagram for the enhanced monitoring device having voltage measurement according to FIG. 11. In this embodiment as well, measuring-voltage source $U_m$ of individual electric subsystems 16 must run synchronously to each other in order to prevent the measuring signals from interfering with each other. Thus, it is possible in an extreme situation, for example, that measuring current $I_m$ imprinted by a measuring signal source 30 cancels itself out via the measuring current imprinted by a different measuring signal source 30. A metrologically optimal function is expected when the measuring-signal amplitudes are adjusted such that the current flows through insulation resistance $R_f$ so as to be distributed approximately evenly on all measuring branches. The insulation resistance is computed for each branch based on the known length ratios of the refrigerant supply, known measuring-voltage amplitudes $U_m$, the values for $U_i$ measured for each measuring branch and corresponding supplied measuring current $I_m$. The overall insulation value is then formed from the sum of the n individual values divided by n.

The invention claimed is:

1. A monitoring device (100, 101, 102) for monitoring an insulation resistance ($R_f$) for an ungrounded electric system (2) which includes a liquid cooling which is operated to ground using a refrigerant (3) and has a supply line (6) and a return line (8), the supply line (6) and the return line (8) each being indicated as a tube section (10) which is connected to a ground potential (PE) in an electrically conductive manner and to which an electrically insulated tube section (12) is connected which has a tube length (li) and is connected to the electric system (2), the monitoring device comprising:
one or two low-impedance measuring signal sources (30) each configured for generating a measuring signal having a measuring voltage ($U_m$), each comprising a ground-potential connection (31) connected to the electrically conductive tube section (10), and each comprising a coupling connection (32);
a coupling-current measuring sensor (40) for measuring a coupling current ($I_{AK}$) which flows in the refrigerant (3) flowing through the electrically insulated tube section (12), a fault-current measuring sensor (42) which is switched downstream of the coupling-current measuring sensor (40) in the direction of the electric system (2) and is configured for measuring a fault current ($I_{Ri}$) which flows in the refrigerant (3) flowing through the electrically insulated tube section (12), a conductive coupling tube element (50) which contacts the refrigerant (3) and is electrically connected to the coupling connection (32) of the measuring signal source (30) for coupling the measuring signal, the coupling tube element (50) being disposed on the electrically insulated tube section (12) between the coupling-current measuring sensor (40) and the fault-current measuring sensor (42) that the tube length (li) of the electrically insulated tube section (12) is divided into a coupling length ($l_{AK}$) extending between the electrically conductive tube section (10) and the coupling tube element (50) and a resistance length ($l_{Ri}$) extending from the coupling tube element (50) to the electric system (2); and
a computing unit (60) which is configured for computing the insulation resistance ($R_f$) from the measuring voltage ($U_m$), the detected coupling current ($I_{AK}$), the detected fault current ($I_{Ri}$), the coupling length ($l_{AK}$) and the resistance length ($l_{Ri}$).

2. The monitoring device (100, 102) according to claim 1, the fault-current measuring sensor (42) comprises a fault-current measuring current transformer which encircles both the supply line (6) and the return line (8), and
the coupling-current measuring sensor (40) comprises a coupling-current measuring current transformer which encircles both the supply line (6) and the return line (8); and
the coupling tube element (50) is realized in one part and is connected to the measuring signal source (30) and the measuring signal is synchronously coupled both into the supply line (6) and the return line (8) in common mode, or
the coupling tube element (50) is divided into two parts in a supply-line coupling tube element (52) and a return-line coupling tube element (54) which are each connected to one of the measuring signal sources (30) and synchronously couple the corresponding measuring signals into the supply line (6) or the return line (8) on one side in common mode.

3. The monitoring device (101) according to claim 1, the fault-current measuring sensor (42) comprises a fault-current measuring current transformer and the coupling-current measuring sensor (42) comprises a coupling-current measuring current transformer, the fault-current measuring current transformer and the coupling-current measuring current transformer both encircle the supply line (6) on one side and the return line (8) on one side, and the coupling tube element (50) is realized in one part and is connected to the measuring signal source (30) and the measuring signal is synchronously coupled together into the supply line (6) and the return line (8) in common mode, or the coupling tube element (50) is divided into two parts in a supply-line coupling tube element (52) and a return-line coupling tube element (54) which are each connected to one of the measuring signal sources (30) and synchronously couple the corresponding measuring signals into the supply line (6) or the return line (8) on one side in common mode.

4. The monitoring device according to claim 1, wherein the ungrounded electric system (2) comprises an ungrounded power converter system.

5. A monitoring device (103) for monitoring an insulation resistance ($R_f$) for an ungrounded electric system (2) which includes a liquid cooling which is operated to ground using a refrigerant (3) and comprises a supply line (6) and a return line (8), the supply line (6) and the return line (8) each being indicated as an electrically conductive tube section (10) which is connected to a ground potential (PE) and to which an electrically insulated tube section (12) is connected which has a tube length (li) and is connected to the electric system (2), a low-impedance measuring signal source (30) configured for generating a measuring signal having a measuring voltage ($U_m$), the measuring signal source (30) comprising a ground-potential connection (31) connected to the electrically conductive tube section (10) and comprising a coupling connection (32);
a voltage meter (70) for measuring a partial voltage (Ui), the voltage meter (70) comprising a first voltage-meter input (72) connected to the coupling connection (32) of the measuring signal source (30), and the voltage meter comprising a second voltage-meter input (74);
a conductive coupling tube element (50) which contacts the refrigerant (3) and is electrically connected to the coupling connection (32) of the measuring signal source (30) for synchronously coupling the measuring signal into the supply line (6) and the return line (8) in common mode;

a conductive voltage-meter tube element (76) which contacts the refrigerant (3) and is connected to the second voltage-meter input (74) of the voltage meter (70);

the coupling tube element (50) being disposed on the electrically insulated tube section (12) that a coupling length ($l_{AK1}$) is yielded between the system-sided end of the electrically conductive tube section (10) and the coupling tube element (50);

the voltage-meter tube element (76) being disposed in such a manner adjacent to the electrically insulated tube section (12) that a voltage-meter length ($l_{AK2}$) is yielded between the coupling tube element (50) and the voltage-meter tube element (76) and a resistance length ($l_{Ri}$) is yielded between the voltage-meter tube element and the electric system; and a computing unit which is configured for computing the insulation resistance from the measuring voltage ($U_m$) of the measuring signal, a supplied measuring current ($I_m$), the partial voltage ($U_i$), the coupling length ($l_{AK1}$), the voltage-meter length ($l_{AK2}$) and the resistance length ($l_{Ri}$).

6. The monitoring device according to claim 5, wherein the ungrounded electric system (2) comprises an ungrounded power converter system.

7. An enhanced monitoring device (110) for monitoring a shared insulation resistance ($R_f$) of several ungrounded electric subsystems (16) which are fed by a shared transformer (15) and each comprise a liquid cooling operated to ground using a refrigerant (3) and comprising a supply line (6) and a return line (8), the supply line (6) and the return line (8) each being realized as an electrically conductive tube section (10) which is connected to a ground potential (PE) and to which an electrically insulated tube section (12) is connected which has a tube length (li) is and connected to the corresponding electric subsystem (16), at least two of the electric subsystems (16) are equipped with a monitoring device (100, 101, 102, 103) according to claim 1, and a synchronization control device (80) for synchronously coupling the measuring signals into the electric subsystems (16) to be monitored is installed.

8. The enhanced monitoring device (110) according to claim 7, the synchronization control device (80) comprises an amplitude control device (82) for controlling the measuring-signal amplitudes of the measuring signals generated in the corresponding monitoring devices (100, 101, 102, 103).

9. A method for monitoring an insulation resistance ($R_f$) for an ungrounded electrical system (2) which includes a liquid cooling which is operated to ground using a refrigerant (3) and has a supply line (6) and a return line (8), the supply line (6) and the return line (8) each being indicated as an electrically conductive tube section (10) which is connected to a ground potential (PE) and to which an electrically insulated tube section (12) is connected which is connected to the electric system (2) and has a tube length (10, the method comprising the steps:

generating a measuring signal having a measuring voltage ($U_m$) using a low-impedance measuring signal source (30), synchronously coupling the measuring voltage ($U_m$) in common mode into the supply line (6) and the return line (8) having a conductive coupling tube element (50) contacted with the refrigerant (3);

measuring a coupling current ($I_{AK}$) which flows in the refrigerant (3), which flows through the electrically insulated tube section (12);

using a coupling-current measuring sensor (40) and measuring a fault current ($I_{Ri}$) which flows in the refrigerant (3), which flows through the electrically insulated tube section (12), using a fault-current measuring sensor (42) switched downstream of the coupling-current measuring sensor (40) in the direction of the electric system (2), the coupling tube element (50) being disposed on the electrically insulated tube section (12) between the coupling-current measuring sensor (40) and the fault-current measuring sensor (42) that the tube length (li) of the electrically insulated tube section (12) is divided into a coupling length (lAx) extending between the electrically conductive tube section (10) and the coupling tube element (50) and a resistance length ($l_{Ri}$) extending from the coupling tube element (50) to the electric system (2); and computing the insulation resistance ($Rf$) from the measuring voltage ($U_m$) of the measuring signal, the detected coupling current ($I_{AK}$), the detected fault current ($I_{Ri}$), the coupling length ($l_{AK}$) and the resistance length ($l_{Ri}$) using a computing unit (60).

10. The monitoring method according to claim 9, monitoring the insulation resistance ($R_f$) for an ungrounded power converter system.

11. A method for monitoring an insulation resistance ($R_f$) for an ungrounded electric system (2) which includes a liquid cooling which is operated to ground using a refrigerant (3) and has a supply line (6) and a return line (8), the supply line (6) and the return line (8) each being indicated as an electrically conductive tube section (10) which is connected to a ground potential (PE) and to which an electrically insulated tube section (12) is connected which is connected to the electric system (2) and has a tube length (li), the method comprising the steps:

generating a measuring signal having a measuring voltage ($U_m$) via a measuring signal source (30) which comprises a ground-potential connection (31), which is connected to the electrically conductive tube section (10), and a coupling connection (32), synchronously coupling the measuring voltage ($U_m$) in common mode into the supply line (6) and the return line (8) having a conductive coupling tube element (50) which is contacted with the refrigerant (3) and is electrically connected to the coupling connection (32) of the measuring signal source (30)

measuring a partial voltage (Ui) using a voltage meter (70) which comprises a first voltage-meter input (72) connected to the coupling connection (32) of the measuring signal source (30) and a second voltage-meter input (74) connected to a conductive voltage-meter tube element (76) contacted with the refrigerant (3), the coupling tube element (50) being disposed on the electrically insulated tube section (12) that a coupling length ($l_{AK1}$) is yielded between the electrically conductive tube section (10) and the coupling tube element (50), and the voltage-meter tube element (76) is adjacently disposed in such a manner on the electrically insulated tube section (12) that a voltage-meter length ($l_{AK2}$) is yielded between the coupling tube element (50) and the voltage-meter tube element (76) and a resistance length ($l_{Ri}$) is yielded between the voltage-meter tube element (76) and the electric system (2); and computing the insulation resistance ($R_f$) from the measuring voltage ($U_m$) of the measuring signal, a supplied measuring current ($I_m$), the partial voltage ($U_i$), the coupling length ($l_{AK1}$), the voltage-meter length ($l_{AK2}$) and the resistance length ($l_{Ri}$).

12. The monitoring method according to claim 11, monitoring the insulation resistance ($R_f$) for an ungrounded power converter system.

13. An enhanced method for monitoring a shared insulation resistance of several ungrounded electric subsystems (16) which are fed by a shared transformer (15) and each comprise a liquid cooling which is operated to ground using a refrigerant (3) and comprises a supply line (6) and a return line (8), the supply line (6) and the return line (8) each being realized as an electrically conductive tube section (10) which is connected to a ground potential (PE) and to which an electrically insulated tube section (12) is connected which is connected to the corresponding electric subsystem (16) and has a tube length ($l_i$), at least two of the ungrounded electric subsystems (16) are monitored using a method for monitoring an insulation resistance according to claim 9 and the measuring signals are synchronously coupled into the subsystems (16) to be monitored by means of a synchronization control device (18).

14. The enhanced monitoring method according to claim 13, that the measuring-signal amplitudes of the measuring signals are controlled by means of an amplitude control device (82).

* * * * *

UNITED STATES PATENT AND TRADEMARK OFFICE
CERTIFICATE OF CORRECTION

| | |
|---|---|
| PATENT NO. | : 11,353,492 B2 |
| APPLICATION NO. | : 17/183445 |
| DATED | : June 7, 2022 |
| INVENTOR(S) | : Dieter Hackl |

It is certified that error appears in the above-identified patent and that said Letters Patent is hereby corrected as shown below:

In the Claims

Column 13, Claim 7, Line 39 – please replace "Ii" with --- $I_i$ ---

Column 13, Claim 9, Line 61 – please replace "(10, the method comprising the steps:" with --- ($I_i$), the method comprising the steps: ---

Column 14, Claim 9, Line 15 – please replace "a coupling length ($I_{AX}$) extending" with --- a coupling length ($I_{AK}$) extending ---

Column 14, Claim 9, Line 20 – please replace "Rf$_f$" with --- $R_f$ ---

Column 14, Claim 11, Line 37 – please replace "Ii" with --- $I_i$ ---

Column 14, Claim 11, Line 49 – please replace "Ui" with --- $U_i$ ---

Signed and Sealed this
Twenty-second Day of November, 2022

Katherine Kelly Vidal
*Director of the United States Patent and Trademark Office*